United States Patent
Li et al.

(10) Patent No.: US 11,640,940 B2
(45) Date of Patent: May 2, 2023

(54) METHODS OF FORMING INTERCONNECTION STRUCTURE INCLUDING CONDUCTIVE GRAPHENE LAYERS

(71) Applicant: TAIWAN SEMICONDUCTOR MANUFACTURING COMPANY, LTD., Hsinchu (TW)

(72) Inventors: Shu-Wei Li, Hsinchu (TW); Yu-Chen Chan, Taichung (TW); Shin-Yi Yang, New Taipei (TW); Ming-Han Lee, Taipei (TW); Shau-Lin Shue, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 64 days.

(21) Appl. No.: 17/314,269

(22) Filed: May 7, 2021

(65) Prior Publication Data
US 2022/0359414 A1    Nov. 10, 2022

(51) Int. Cl.
*H01L 21/768*    (2006.01)
*H01L 23/532*    (2006.01)

(52) U.S. Cl.
CPC .. *H01L 23/53276* (2013.01); *H01L 21/76837* (2013.01); *H01L 21/76885* (2013.01)

(58) Field of Classification Search
None
See application file for complete search history.

(56) References Cited

U.S. PATENT DOCUMENTS

| | | |
|---|---|---|
| 9,105,490 B2 | 8/2015 | Wang et al. |
| 9,236,267 B2 | 1/2016 | De et al. |
| 9,236,300 B2 | 1/2016 | Liaw |
| 9,406,804 B2 | 8/2016 | Huang et al. |
| 9,443,769 B2 | 9/2016 | Wang et al. |
| 9,520,482 B1 | 12/2016 | Chang et al. |
| 9,548,366 B1 | 1/2017 | Ho et al. |
| 9,576,814 B2 | 2/2017 | Wu et al. |
| 9,831,183 B2 | 11/2017 | Lin et al. |
| 9,859,386 B2 | 1/2018 | Ho et al. |
| 2013/0143000 A1* | 6/2013 | Afzali-Ardakani ..... B32B 9/007 977/734 |

(Continued)

*Primary Examiner* — Erik Kielin
(74) *Attorney, Agent, or Firm* — NZ Carr Law Office

(57) ABSTRACT

An interconnection structure, along with methods of forming such, are described. The interconnection structure includes a first portion of a conductive layer, and the conductive layer includes one or more graphene layers. The first portion of the conductive layer includes a first interface portion and a second interface portion opposite the first interface portion, and each of the first and second interface portion includes a metal disposed between adjacent graphene layers. The structure further includes a second portion of the conductive layer disposed adjacent the first portion of the conductive layer, and the second portion of the conductive layer includes a third interface portion and a fourth interface portion opposite the third interface portion. Each of the third and fourth interface portion includes the metal disposed between adjacent graphene layers. The structure further includes a dielectric material disposed between the first and second portions of the conductive layer.

20 Claims, 17 Drawing Sheets

(56) References Cited

U.S. PATENT DOCUMENTS

| | | | |
|---|---|---|---|
| 2014/0084250 A1* | 3/2014 | Wada | H01L 29/66977 977/734 |
| 2015/0235960 A1* | 8/2015 | Sato | H01L 21/76883 257/746 |
| 2017/0062346 A1* | 3/2017 | Isobayashi | H01L 23/53276 |
| 2017/0084484 A1* | 3/2017 | Reber | H01L 23/53276 |

* cited by examiner

METHODS OF FORMING INTERCONNECTION STRUCTURE INCLUDING CONDUCTIVE GRAPHENE LAYERS

BACKGROUND

As the semiconductor industry introduces new generations of integrated circuits (IC) having higher performance and more functionality, the density of the elements forming the ICs increases, while the dimensions, sizes and spacing between components or elements are reduced. In the past, such reductions were limited only by the ability to define the structures photo-lithographically, device geometries having smaller dimensions created new limiting factors. For example, with the dimensions of the metallic conductive features in back-end-of-line (BEOL) interconnection structure getting smaller, sheet resistance and contact resistance increase. Therefore, improved conductive features are needed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
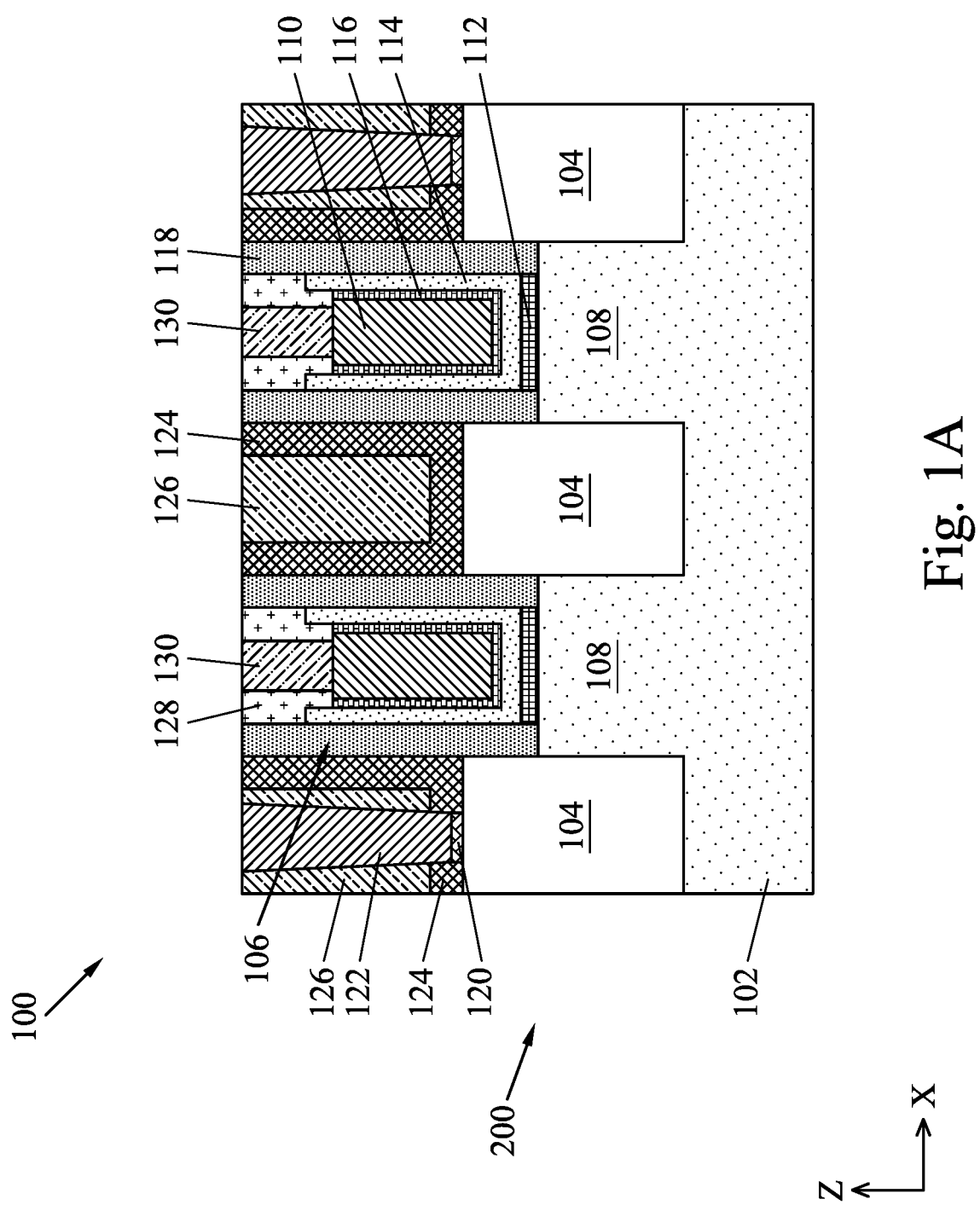
FIGS. 1A and 1B are cross-sectional views of one of the various stages of manufacturing a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "on," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIGS. 1A-4E show exemplary sequential processes for manufacturing a semiconductor device structure 100, in accordance with some embodiments. It is understood that additional operations can be provided before, during, and after processes shown by FIGS. 1A-4E, and some of the operations described below can be replaced or eliminated, for additional embodiments of the process. The order of the operations/processes may be interchangeable.

Figure 1B:
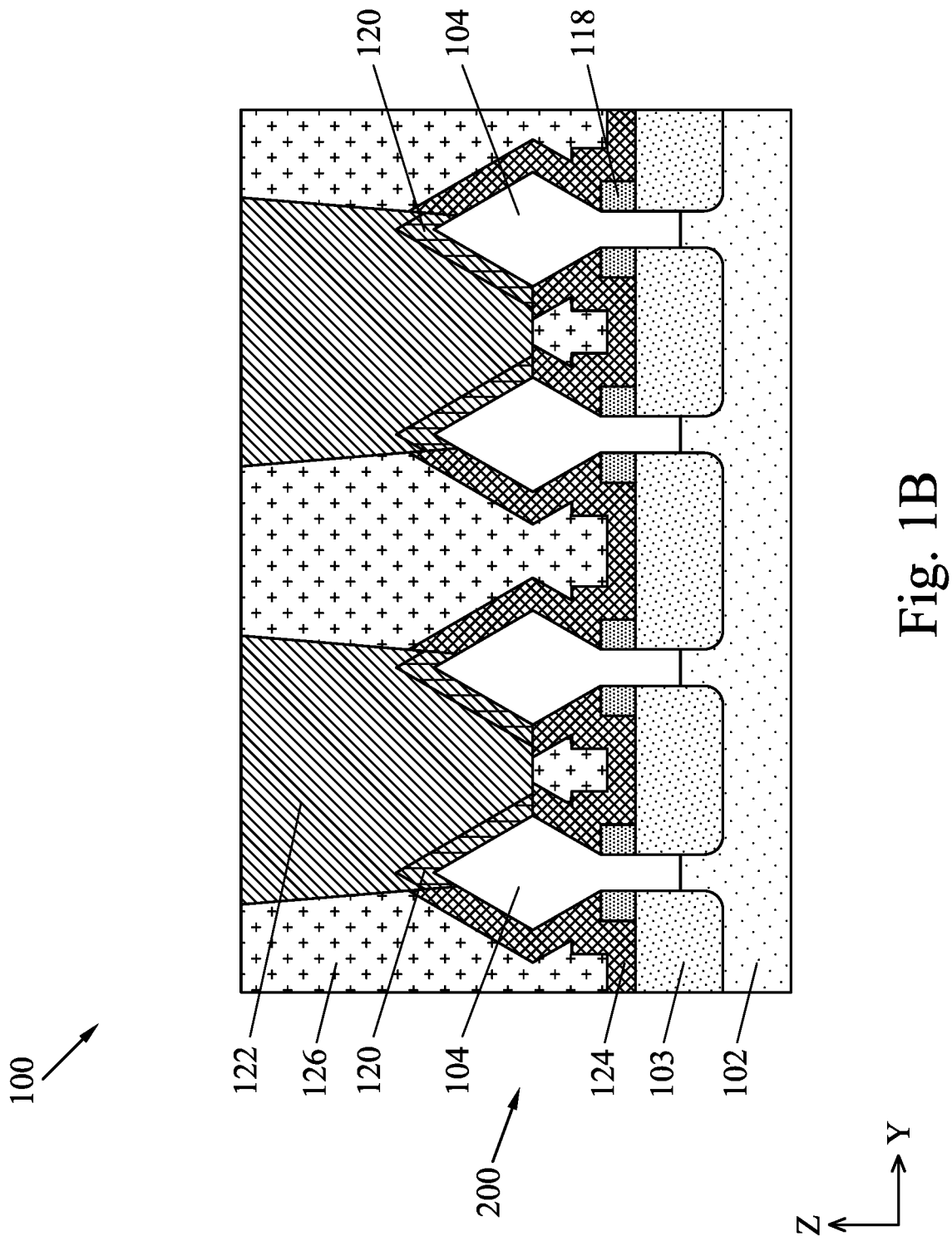

FIGS. 1A and 1B are cross-sectional side views of one of various stages of manufacturing the semiconductor device structure 100, in accordance with some embodiments. As shown in FIGS. 1A and 1B, the semiconductor device structure 100 includes a substrate 102 and one or more devices 200 formed on the substrate 102. The substrate 102 may be a semiconductor substrate. In some embodiments, the substrate 102 includes a single crystalline semiconductor layer on at least the surface of the substrate 102. The substrate 102 may include a single crystalline semiconductor material such as, but not limited to silicon (Si), germanium (Ge), silicon germanium (SiGe), gallium arsenide (GaAs), indium antimonide (InSb), gallium phosphide (GaP), gallium antimonide (GaSb), indium aluminum arsenide (InAlAs), indium gallium arsenide (InGaAs), gallium antimony phosphide (GaSbP), gallium arsenic antimonide (GaAsSb), and indium phosphide (InP). For example, the substrate 102 is made of Si. In some embodiments, the substrate 102 is a silicon-on-insulator (SOI) substrate, which includes an insulating layer (not shown) disposed between two silicon layers. In one aspect, the insulating layer is an oxygen-containing material, such as an oxide.

The substrate 102 may include one or more buffer layers (not shown) on the surface of the substrate 102. The buffer layers can serve to gradually change the lattice constant from that of the substrate to that of the source/drain regions. The buffer layers may be formed from epitaxially grown single crystalline semiconductor materials such as, but not limited to Si, Ge, germanium tin (GeSn), SiGe, GaAs, InSb, GaP, GaSb, InAlAs, InGaAs, GaSbP, GaAsSb, GaN, GaP, and InP. In one embodiment, the substrate 102 includes SiGe buffer layers epitaxially grown on the silicon substrate 102. The germanium concentration of the SiGe buffer layers may increase from 30 atomic percent germanium for the bottom-most buffer layer to 70 atomic percent germanium for the top-most buffer layer.

The substrate 102 may include various regions that have been suitably doped with impurities (e.g., p-type or n-type impurities). The dopants are, for example phosphorus for an n-type fin field effect transistor (FinFET) and boron for a p-type FinFET.

As described above, the devices 200 may be any suitable devices, such as transistors, diodes, imaging sensors, resistors, capacitors, inductors, memory cells, or a combination thereof. In some embodiments, the devices 200 are transistors, such as planar field effect transistors (FETs), FinFETs, nanostructure transistors, or other suitable transistors. The nanostructure transistors may include nanosheet transistors, nanowire transistors, gate-all-around (GAA) transistors, multi-bridge channel (MBC) transistors, or any transistors having the gate electrode surrounding the channels. An example of the device 200 formed on the substrate 102 is a FinFET, which is shown in FIGS. 1A and 1B. The device 200 includes source/drain (S/D) regions 104 and gate stacks 106. Each gate stack 106 may be disposed between S/D regions 104 serving as source regions and S/D regions 104 serving as drain regions. For example, each gate stack 106 may extend along the Y-axis between a plurality of S/D regions 104 serving as source regions and a plurality of S/D regions 104 serving as drain regions. As shown in FIG. 1A, two gate stacks 106 are formed on the substrate 102. In some embodiments, more than two gate stacks 106 are formed on the substrate 102. Channel regions 108 are formed between S/D regions 104 serving as source regions and S/D regions 104 serving as drain regions.

The S/D regions 104 may include a semiconductor material, such as Si or Ge, a III-V compound semiconductor, a II-VI compound semiconductor, or other suitable semiconductor material. Exemplary S/D region 104 may include, but are not limited to, Ge, SiGe, GaAs, AlGaAs, GaAsP, SiP, InAs, AlAs, InP, GaN, InGaAs, InAlAs, GaSb, AlP, GaP, and the like. The S/D regions 104 may include p-type dopants, such as boron; n-type dopants, such as phosphorus or arsenic; and/or other suitable dopants including combinations thereof. The S/D regions 104 may be formed by an epitaxial growth method using CVD, atomic layer deposition (ALD) or molecular beam epitaxy (MBE). The channel regions 108 may include one or more semiconductor materials, such as Si, Ge, GeSn, SiGe, GaAs, InSb, GaP, GaSb, InAlAs, InGaAs, GaSbP, GaAsSb, GaN, GaP, or InP. In some embodiments, the channel regions 108 include the same semiconductor material as the substrate 102. In some embodiments, the devices 200 are FinFETs, and the channel regions 108 are a plurality of fins disposed below the gate stacks 106. In some embodiments, the devices 200 are nanostructure transistors, and the channel regions 108 are surrounded by the gate stacks 106.

Each gate stack 106 includes a gate electrode layer 110 disposed over the channel region 108 (or surrounding the channel region 108 for nanostructure transistors). The gate electrode layer 110 may be a metal-containing material such as tungsten, cobalt, aluminum, ruthenium, copper, multilayers thereof, or the like, and can be deposited by ALD, plasma enhanced chemical vapor deposition (PECVD), MBD, physical vapor deposition (PVD), or any suitable deposition technique. Each gate stack 106 may include an interfacial dielectric layer 112, a gate dielectric layer 114 disposed on the interfacial dielectric layer 112, and one or more conformal layers 116 disposed on the gate dielectric layer 114. The gate electrode layer 110 may be disposed on the one or more conformal layers 116. The interfacial dielectric layer 112 may include a dielectric material, such as an oxygen-containing material or a nitrogen-containing material, or multilayers thereof, and may be formed by any suitable deposition method, such as CVD, PECVD, or ALD. The gate dielectric layer 114 may include a dielectric material such as an oxygen-containing material or a nitrogen-containing material, a high-k dielectric material having a k value greater than that of silicon dioxide, or multilayers thereof. The gate dielectric layer 114 may be formed by any suitable method, such as CVD, PECVD, or ALD. The one or more conformal layers 116 may include one or more barrier layers and/or capping layers, such as a nitrogen-containing material, for example tantalum nitride (TaN), titanium nitride (TiN), or the like. The one or more conformal layers 116 may further include one or more work-function layers, such as aluminum titanium carbide, aluminum titanium oxide, aluminum titanium nitride, or the like. The term "conformal" may be used herein for ease of description upon a layer having substantial same thickness over various regions. The one or more conformal layers 116 may be deposited by ALD, PECVD, MBD, or any suitable deposition technique.

Gate spacers 118 are formed along sidewalls of the gate stacks 106 (e.g., sidewalls of the gate dielectric layers 114). The gate spacers 118 may include silicon oxycarbide, silicon nitride, silicon oxynitride, silicon carbon nitride, the like, multi-layers thereof, or a combination thereof, and may be deposited by CVD, ALD, or other suitable deposition technique.

Portions of the gate stacks 106 and the gate spacers 118 may be formed on isolation regions 103. The isolation regions 103 are formed on the substrate 102. The isolation regions 103 may include an insulating material such as an oxygen-containing material, a nitrogen-containing material, or a combination thereof. The insulating material may be formed by a high-density plasma chemical vapor deposition (HDP-CVD), a flowable chemical vapor deposition (FCVD), or other suitable deposition process. In one aspect, the isolation regions 103 includes silicon oxide that is formed by a FCVD process.

A contact etch stop layer (CESL) 124 is formed on a portion of the S/D regions 104 and the isolation region 103, and an interlayer dielectric (ILD) layer 126 is formed on the CESL 124. The CESL 124 can provide a mechanism to stop an etch process when forming openings in the ILD layer 126. The CESL 124 may be conformally deposited on surfaces of the S/D regions 104 and the isolation regions 103. The CESL 124 may include an oxygen-containing material or a nitrogen-containing material, such as silicon nitride, silicon carbon nitride, silicon oxynitride, carbon nitride, silicon oxide, silicon carbon oxide, or the like, or a combination thereof, and may be deposited by CVD, PECVD, ALD, or any suitable deposition technique. The ILD layer 126 may include an oxide formed by tetraethylorthosilicate (TEOS), un-doped silicate glass, or doped silicon oxide such as borophosphosilicate glass (BPSG), fused silica glass (FSG), phosphosilicate glass (PSG), boron doped silicon glass (BSG), organosilicate glass (OSG), SiOC, and/or any suitable low-k dielectric materials (e.g., a material having a dielectric constant lower than silicon dioxide), and may be deposited by spin-on, CVD, FCVD, PECVD, PVD, or any suitable deposition technique.

A silicide layer 120 is formed on at least a portion of each S/D region 104, as shown in FIGS. 1A and 1B. The silicide layer 120 may include a material having one or more of WSi, CoSi, NiSi, TiSi, MoSi and TaSi. In some embodiments, the silicide layer 120 includes a metal or metal alloy silicide, and the metal includes a noble metal, a refractory metal, a rare earth metal, alloys thereof, or combinations thereof. A conductive contact 122 is disposed on each silicide layer 120. The conductive contact 122 may include a material having one or more of Ru, Mo, Co, Ni. W, Ti, Ta, Cu, Al, TiN or TaN, and the conductive contact 122 may be formed by any suitable method, such as electro-chemical plating (ECP), or PVD. The silicide layer 120 and the conductive contact 122 may be formed by first forming an opening in the ILD layer 126 and the CESL 124 to expose at least a portion of the S/D region 104, then forming the silicide layer 120 on the exposed portion of the S/D region 104, and then forming the conductive contact 122 on the silicide layer 120.

A dielectric material 128 may be formed over the gate stack 106, and a conductive contact 130 is formed in the dielectric material 128, as shown in FIG. 1A. The dielectric material 128 may be a nitrogen-containing material, such as SiCN. The conductive contact 130 may include the same material as the conductive contact 122. The conductive contact 130 may be electrically connected to the gate electrode layer 110.

Figure 2:
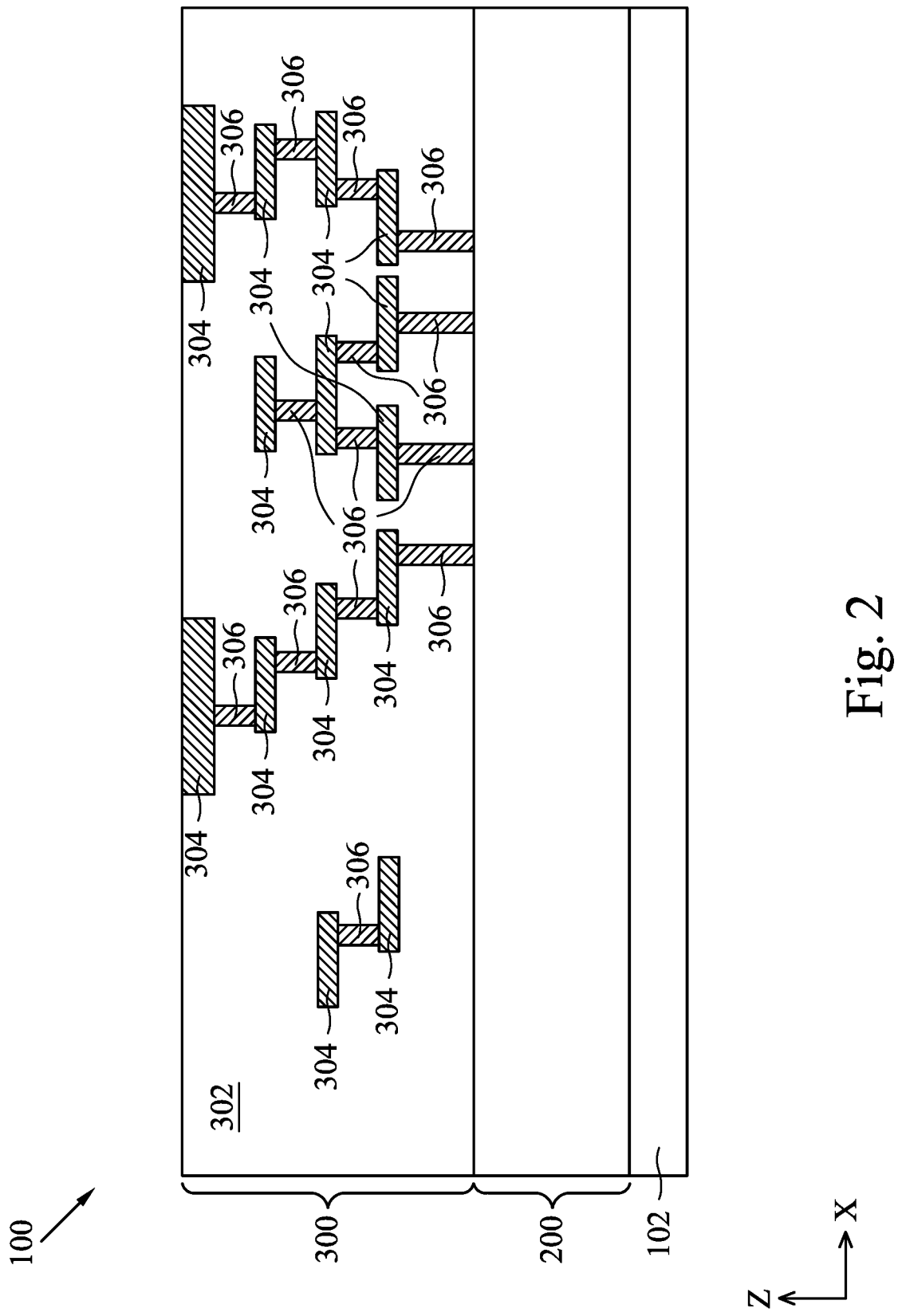
FIG. 2 is a cross-sectional side view of a stage of manufacturing an interconnection structure, in accordance with some embodiments.

The semiconductor device structure 100 may further include an interconnection structure 300 disposed over the devices 200 and the substrate 102, as shown in FIG. 2. The interconnection structure 300 includes various conductive features, such as a first plurality of conductive features 304 and second plurality of conductive features 306, and an intermetal dielectric (IMD) layer 302 to separate and isolate various conductive features 304, 306. In some embodiments, the first plurality of conductive features 304 are conductive lines and the second plurality of conductive features 306 are conductive vias. The interconnection structure 300 includes multiple levels of the conductive features 304, and the conductive features 304 are arranged in each level to provide electrical paths to various devices 200 disposed below. The conductive features 306 provide vertical electrical routing from the devices 200 to the conductive features 304 and between conductive features 304. For example, the bottom-most conductive features 306 of the interconnection structure 300 may be electrically connected to the conductive contacts 122, 130 (FIG. 1A). The conductive features 304 and conductive features 306 may be made from one or more electrically conductive materials, such as one or more layers of graphene, metal, metal alloy, metal nitride, or silicide. For example, the conductive features 304 and the conductive features 306 are made from copper, aluminum, aluminum copper alloy, titanium, titanium nitride, tantalum, tantalum nitride, titanium silicon nitride, zirconium, gold, silver, cobalt, nickel, tungsten, tungsten nitride, tungsten silicon nitride, platinum, chromium, molybdenum, hafnium, other suitable conductive material, or a combination thereof.

The IMD layer 302 includes one or more dielectric materials to provide isolation functions to various conductive features 304, 306. The IMD layer 302 may include multiple dielectric layers embedding multiple levels of conductive features 304, 306. The IMD layer 302 is made from a dielectric material, such as $SiO_x$, $SiO_xC_yH_z$, or $SiO_xC_y$, where x, y and z are integers or non-integers. In some embodiments, the IMD layer 302 includes a low-k dielectric material having a k value less than that of silicon oxide. In some embodiments, the IMD layer 302 has a k value ranging from about 1.5 to about 3.9.

Figure 3A:
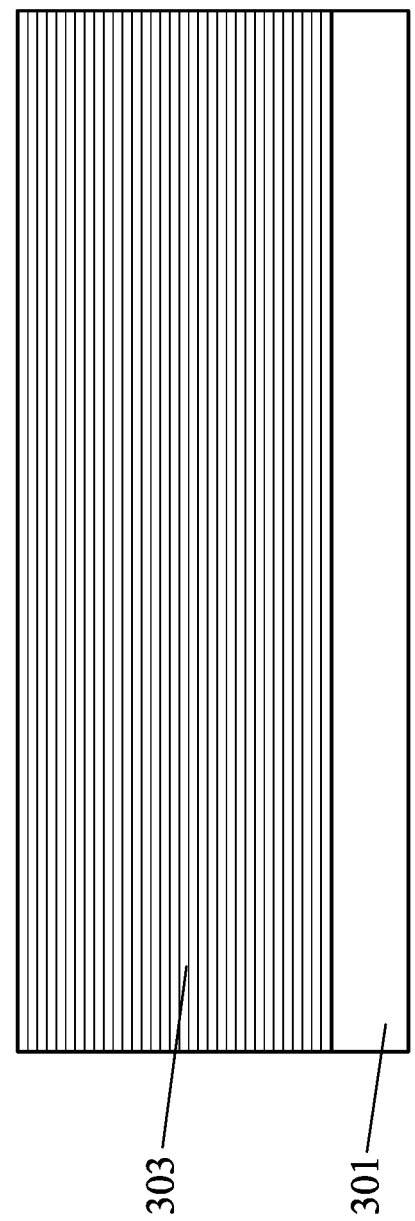
FIGS. 3A-3I are cross-sectional side views of various stages of manufacturing an interconnection structure, in accordance with some embodiments.

FIGS. 3A-3I are cross-sectional side views of various stages of manufacturing the interconnection structure 300, in accordance with some embodiments. As shown in FIG. 3A, a conductive layer 303 is formed over a dielectric layer 301. The conductive layer 303 includes one or more layers of graphene, such as 1 to 1000 layers of graphene. The graphene layers may be horizontally oriented as shown in FIG. 3A, or vertically oriented. The conductive layer 303 may be intercalated with one or more materials such as metals, organic compounds, inorganic compounds, polymers and hybrid thereof, or other suitable materials. In some embodiments, the intercalated material decreases the resistivity of the conductive layer 303. For example, one or more metals may be formed between layers of graphene to decrease the resistivity of the conductive layer 303. The conductive layer 303 may be formed by any suitable process, such as chemical vapor deposition (CVD) plasma enhanced CVD (PECVD), atomic layer deposition (ALD), transferred, or mechanical exfoliation. In some embodiments, the conductive layer 303 includes a plurality of graphene layers formed by direct thermal growth, plasma-assisted, diffusion assisted, or transfer process. The plurality of graphene layers may be grown using aliphatic, aromatic type organic materials or biomaterial as precursors. The precursors may be in gas, liquid, or solid phase. In some embodiments, the graphene layers are formed using un-zip carbon nano tubes (CNT). The conductive layer 303 may have a thickness ranging from about 3 Angstroms to about 10000 Angstroms, such as from about 30 Angstroms to about 10000 Angstroms. The dielectric layer 301 may include the same material as the IMD layer 302. In some embodiments, one or more conductive features (not shown) are formed in the dielectric layer 301. The dielectric layer 301 may be a dielectric layer of the IMD layer 302, and the one or more conductive features (not shown) formed in the dielectric layer 301 may be one or more conductive features 304, 306 shown in FIG. 2.

Figure 3B:
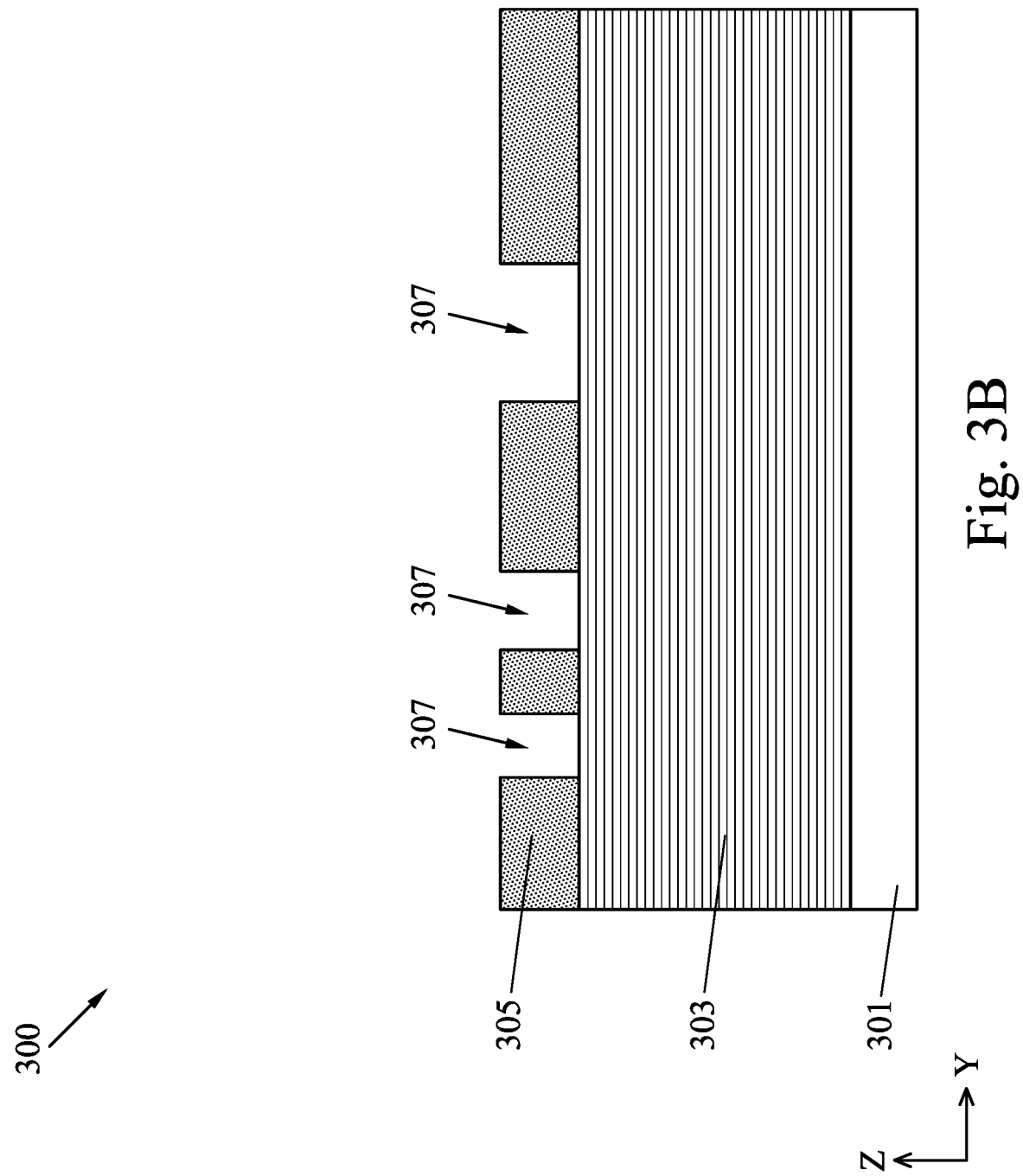

As shown in FIG. 3B, a patterned mask layer 305 is formed on the conductive layer 303. One or more openings 307 are formed in the patterned mask layer 305, and portions of the conductive layer 303 are exposed in the openings 307. The patterned mask layer 305 may include a dielectric material, such as an oxygen-containing material or a nitrogen containing material. In some embodiments, the patterned mask layer 305 includes SiN, SiCN, SiO, SiCO, or other suitable material. The patterned mask layer 305 may have a thickness ranging from about 3 Angstroms to about 3000 Angstroms. In some embodiments, the thickness of the patterned mask layer 305 is about 1 percent to about 100 percent of the thickness of the conductive layer 303. The patterned mask layer 305 may be formed by first forming a blanket mask layer on the conductive layer 303 and then patterning the blanket mask layer to from the patterned mask layer 305.

Figure 3C:
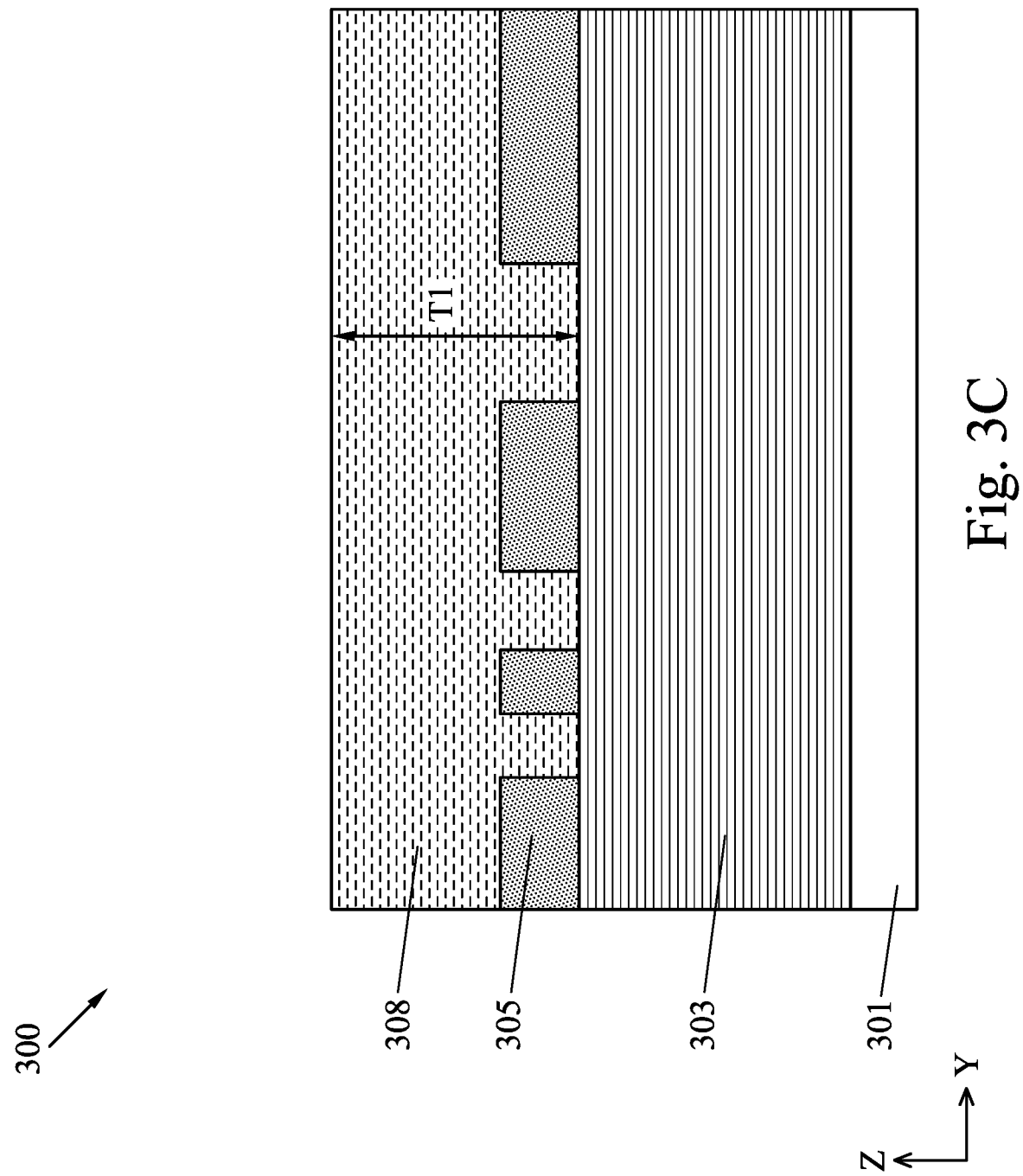

As shown in FIG. 3C, a metal layer 308 is formed in the openings 307 and on the patterned mask layer 305. The metal layer 308 may include a metal, such as Co, Cu, Ni, Ru, W, Mo, Ti, Zr, Ta, or Zn, and may be formed by any suitable process, such as PVD. The metal layer 308 may have a thickness T1 ranging from about 10 Angstroms to about 600 Angstroms.

Figure 3D:
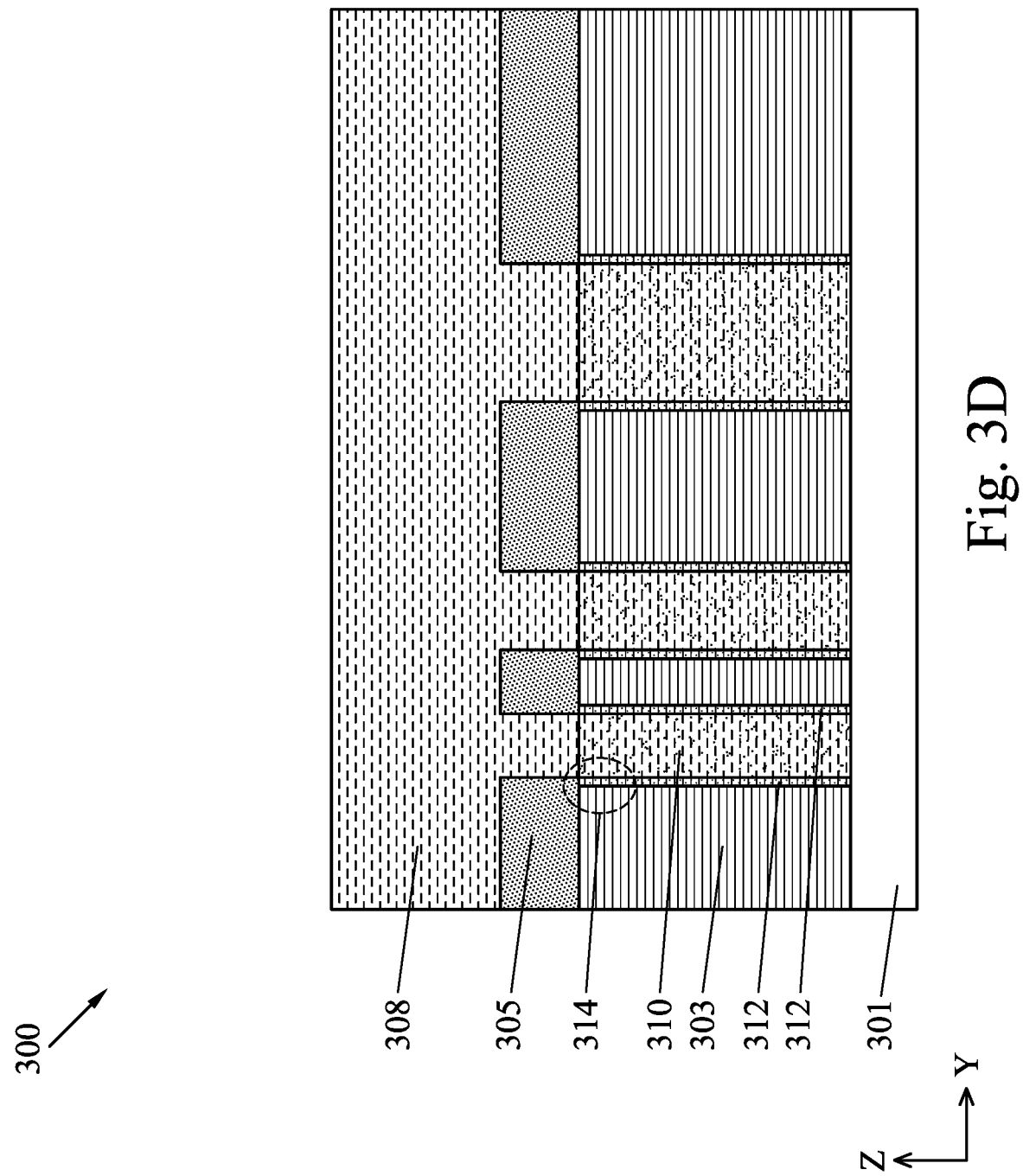

As shown in FIG. 3D, the interconnection structure 300 may be heated to a temperature less than about 800 degrees Celsius, such as from about 200 degrees Celsius to about 450 degrees Celsius. The heating of the interconnection structure 300 may be an anneal process. At such elevated temperature, the metal layer 308 dissolves the portions of the conductive layer 303 to form carbon-doped metal layer portions 310. For example, the metal atoms from the metal layer 308 break the bonds in a portion of each graphene layer of the conductive layer 303. The carbon released from the broken bonds in the graphene layers become dopants, thus forming the carbon-doped metal layer portion 310. Because graphene is a two-dimensional (2D) material and the graphene layers of the conductive layer 303 are horizontally oriented, the metal atoms break the bonds in the graphene layers along the Z direction. Any metal atoms diffuse in the conductive layer 303 along the Y or X direction do not break the bonds and are disposed between the graphene layers. As a result, the carbon-doped metal layer portion 310 may be substantially aligned with the corresponding portion of the metal layer 308 formed in the opening 307 (FIG. 3B). Interface portions 312 of the conductive layer 303 may be formed adjacent the carbon-doped metal layer portion 310. The interface portion 312 may include a metal intercalated between adjacent graphene layers. The patterned mask layer 305 may function as a barrier layer that blocks the diffusion of metal from the metal layer 308 to the portions of the conductive layer 303 located under the patterned mask layer 305. Because the thicker the conductive layer 303, the higher temperature or longer heating time for the metal layer 308 to dissolve portions of the conductive layer 303. Thus, if the thickness of the patterned mask layer 305 is less than about 1 percent of the thickness of the conductive layer 303, the patterned mask layer 305 may be not sufficient to block the metal from diffusing into the portions of the conductive layer 303 located under the mask layer 305. On the other hand, if the thickness of the patterned mask layer 305 is greater than about 100 percent of the thickness of the conductive layer 303, manufacturing cost may be increased without significant advantage. In some embodiments, the carbon-doped metal layer portion 310 extends through the conductive layer 303 and is in contact with the dielectric layer 301.

Figure 3E:
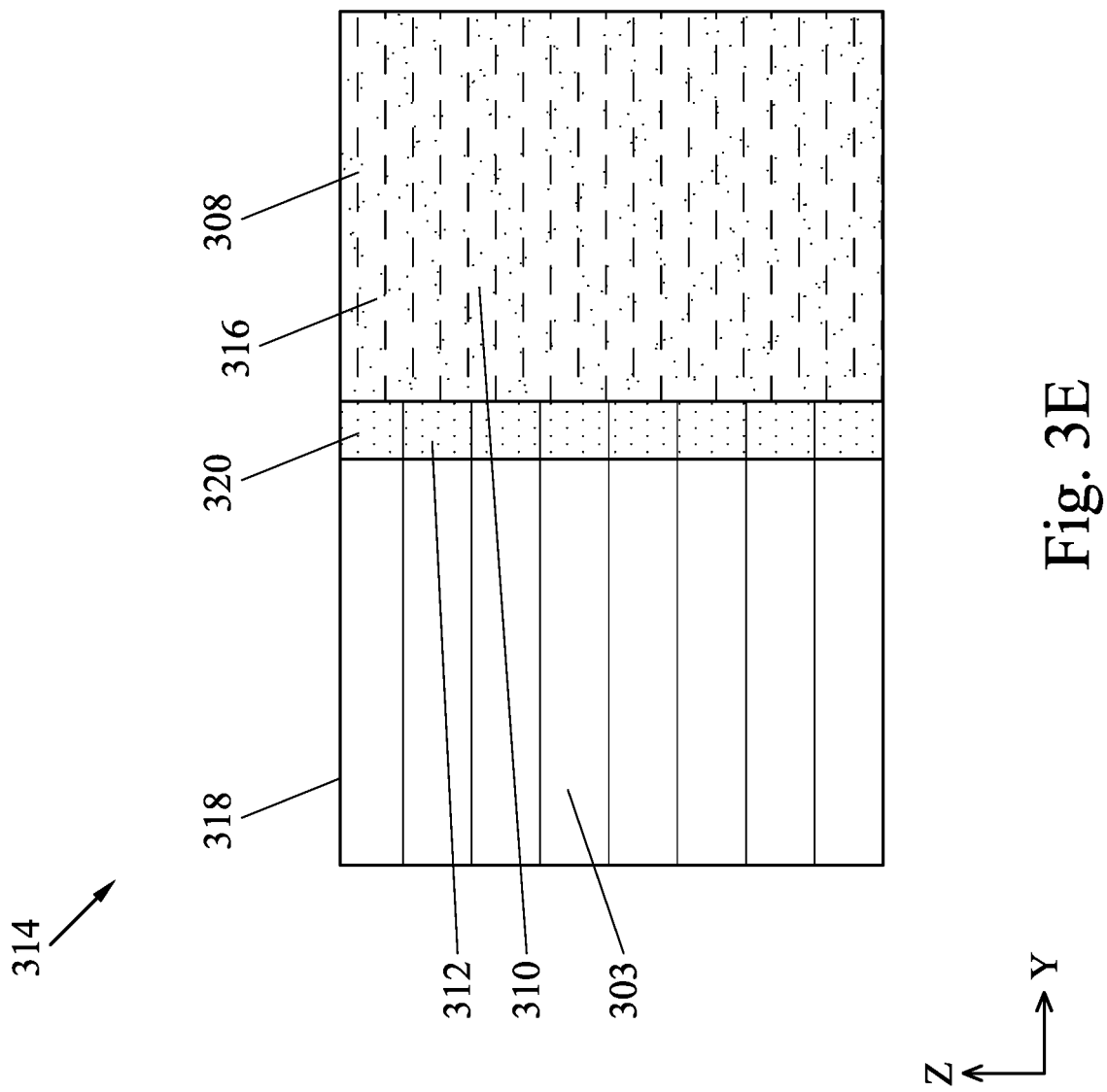
Figure 3F:
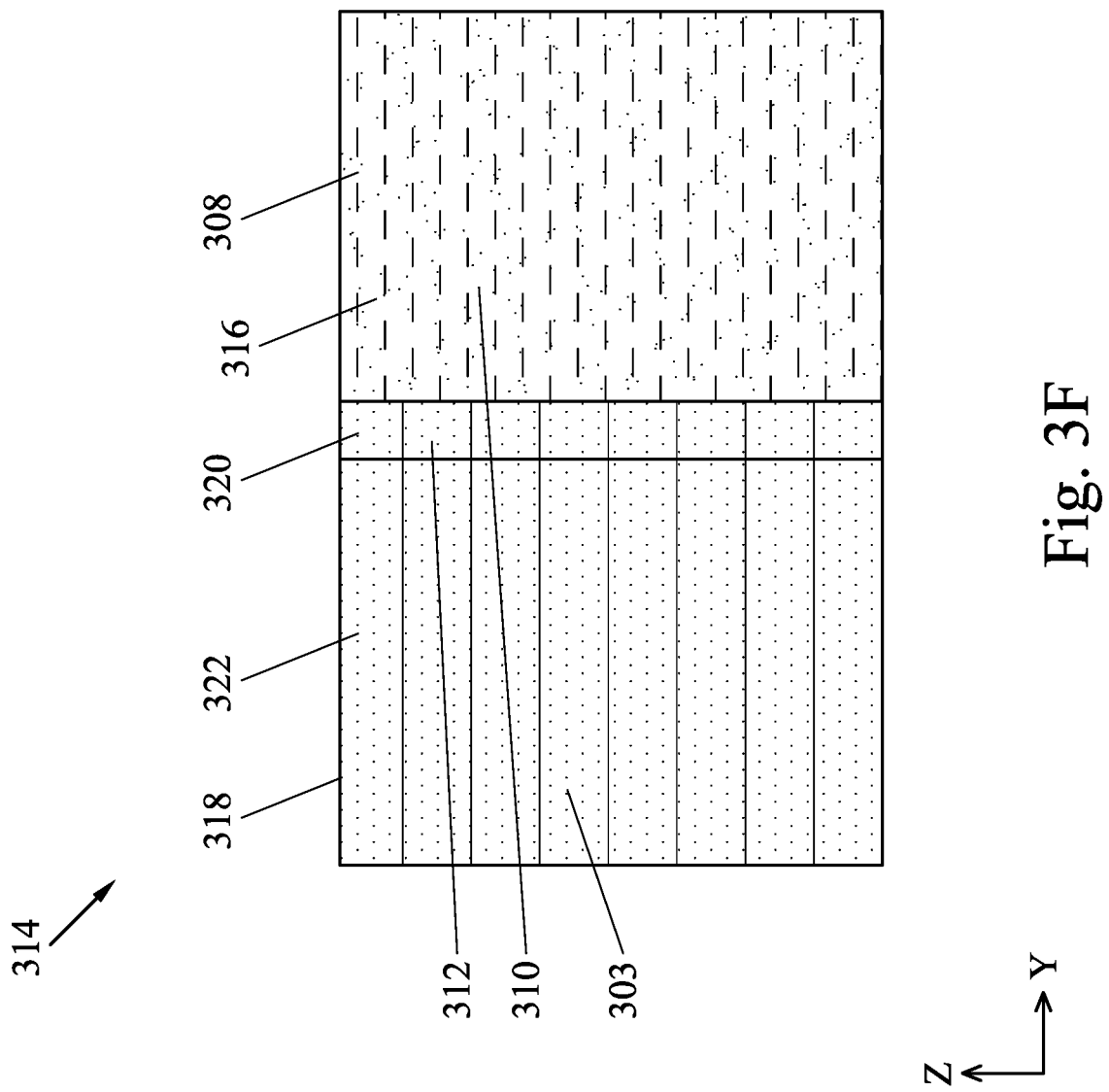

FIGS. 3E and 3F are enlarged view of region 314 shown in FIG. 3D, in accordance with some embodiments. As shown in FIG. 3E, the carbon-doped metal layer portion 310 includes the metal layer 308 and carbon dopant 316. The adjacent interface portion 312 includes the graphene layers 318 and a metal 320 formed between adjacent graphene layers 318. The amount of metal 320 between adjacent graphene layers 318 may decrease along the Y direction away from the carbon-doped metal layer portion 310 as a result of the diffusion. The metal 320 includes the same material as the metal layer 308. In the embodiment shown in FIG. 3E, the conductive layer 303 does not have any materials intercalated therein. In some embodiments, as shown in FIG. 3F, the conductive layer 303 may be intercalated with a material 322. In some embodiments, the material 322 is different from the metal 320.

Figure 3G:
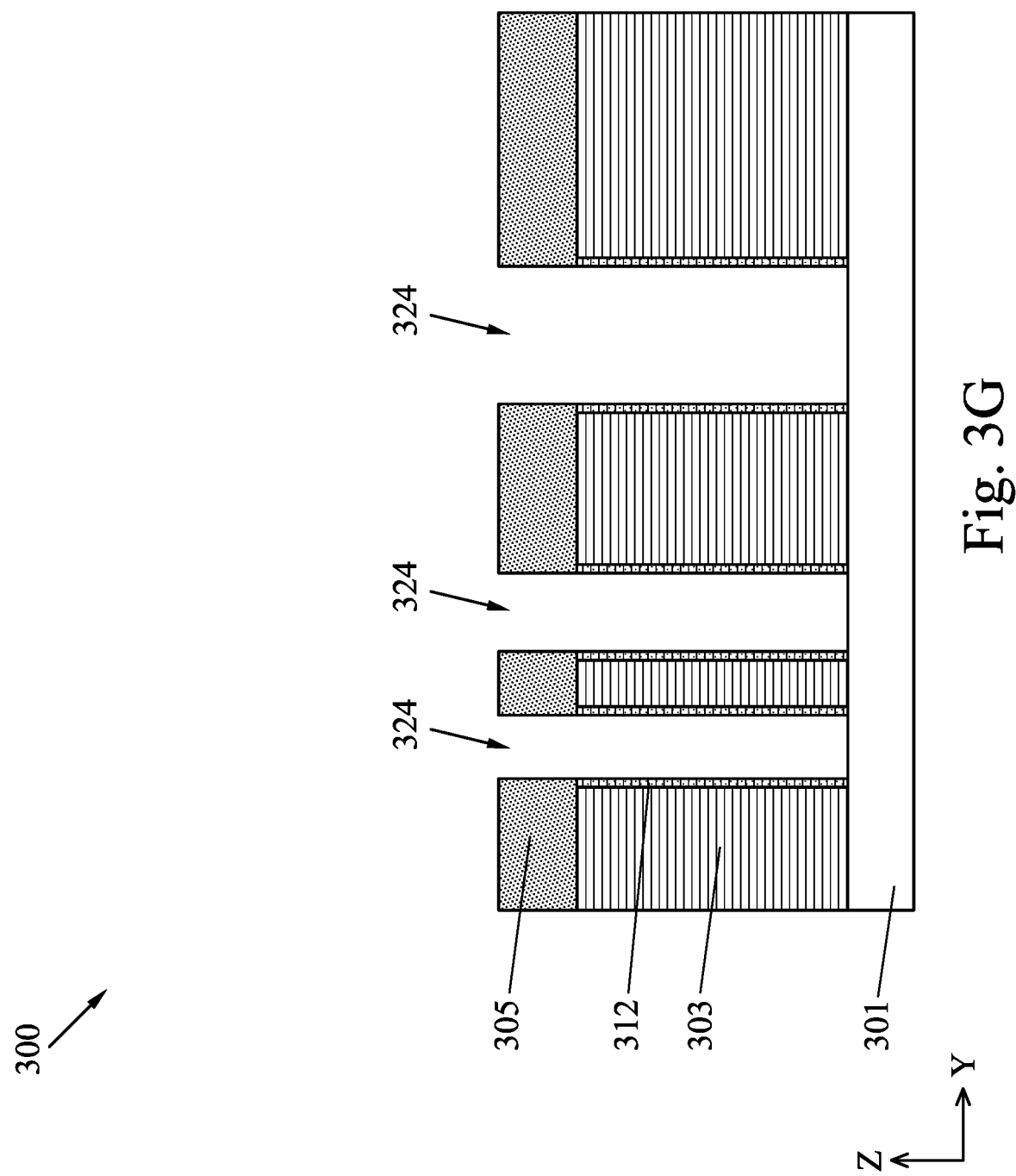

As shown in FIG. 3G, a plasma-free etch process is performed to remove the metal layer 308 (FIG. 3D) and the carbon-doped metal layer portions 310 (FIG. 3D). In some embodiments, the plasma-free etch process may be a wet etch process that selectively removes the metal layer 308 and the carbon-doped metal layer portions 310, while the patterned mask layer 305, the conductive layer 303, and the dielectric layer 301 are not substantially affected. A plasma etch process that utilizes an etchant such as oxygen may etch graphene layers. However, the etchant of the plasma etch process can damage the dielectric layer 301 and/or conductive features (not shown) disposed in the dielectric layer 301. Thus, with the plasm-free etch process, such as a wet process, the conductive layer 303 can be patterned without damaging the dielectric layer 301 and the conductive features (not shown) disposed in the dielectric layer 301. As a result of the plasma-free etch process, openings 324 are formed in the conductive layer 303. The openings 324 separates the conductive layer 303 into a plurality of portions. Each portion of the conductive layer 303 may be a conductive feature, such as a conductive line or a conductive via. In some embodiments, the plurality of portions of the conductive layer 303 may be the conductive features 304 or the conductive features 306 shown in FIG. 2. The interface portions 312 may be exposed in the openings 324.

Figure 3H:
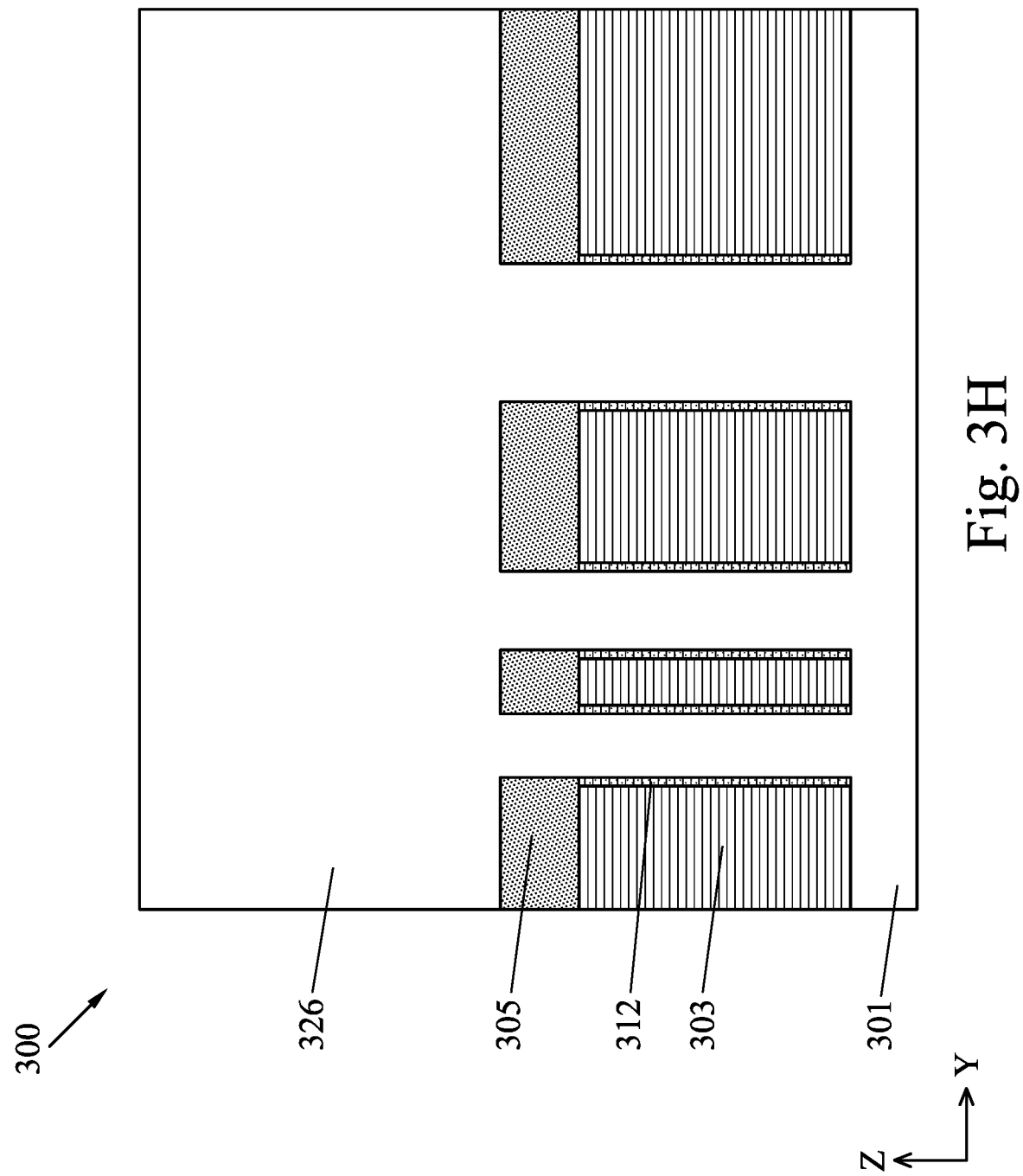
Figure 3I:
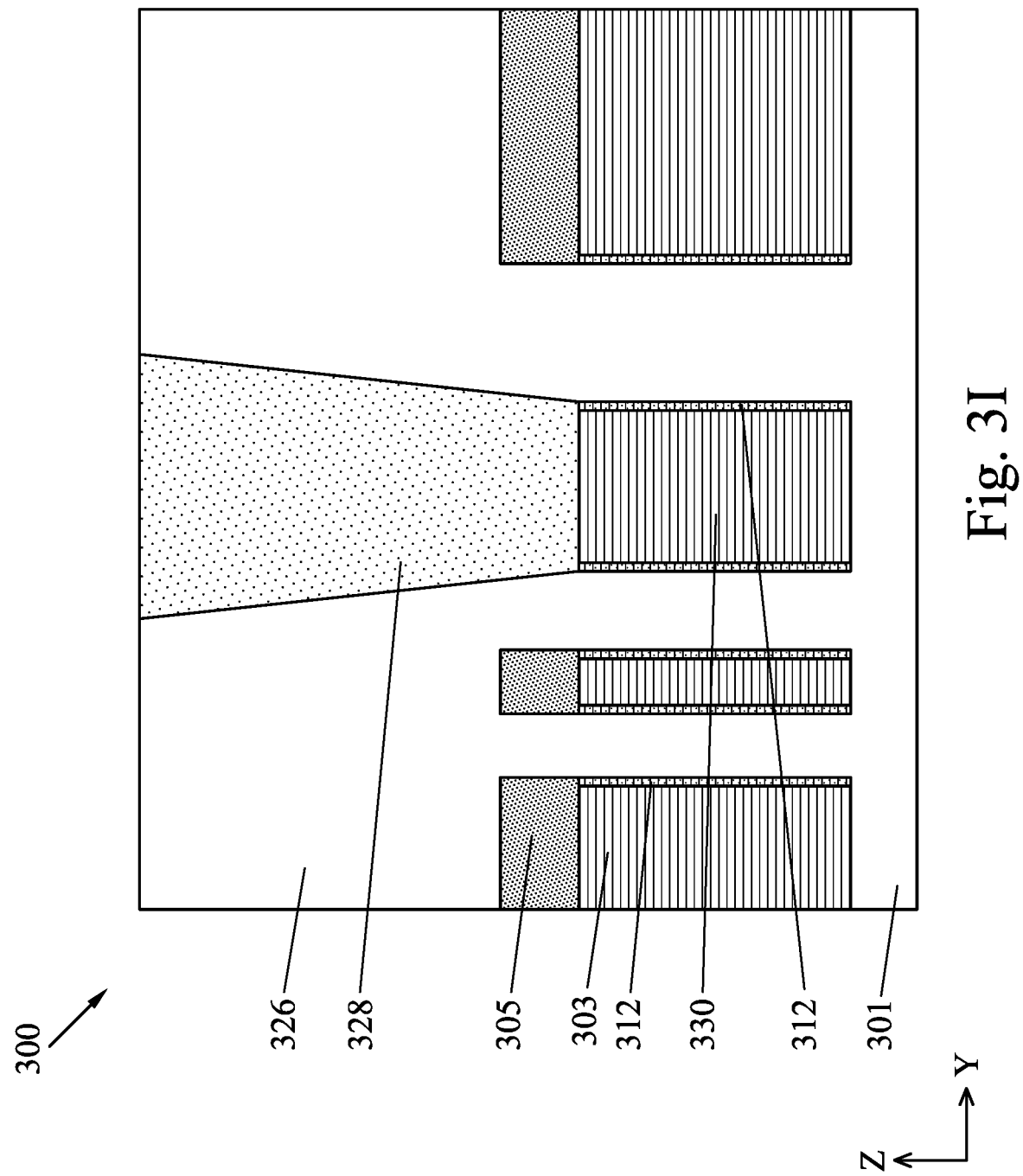

As shown in FIG. 3H, a dielectric material 326 is formed in the openings 324 and over the patterned mask layer 305. The dielectric material 326 may include the same material as the dielectric layer 301 and may be formed by any suitable process, such as CVD, FCVD, or PECVD. The dielectric material 326 may be in contact with the interface portions 312. As shown in FIG. 3I, a conductive feature 328 may be formed in the dielectric material 326 and over a portion of the conductive layer 303. The conductive feature 328 may include the same material as the conductive feature 304 or conductive feature 306. In some embodiments, the conductive feature 328 include the same material as the conductive layer 303. The portion of the patterned mask layer 305 disposed on the portion of the conductive layer 303 may be removed, and the conductive feature 328 may be in contact with the portion of the conductive layer 303.

In some embodiments, as shown in FIG. 3I, the interconnection structure 300 includes a first portion of the conductive layer 303, a second portion of the conductive layer 303 disposed adjacent the first portion of the conductive layer 303, and the dielectric material 326 disposed between the first portion of the conductive layer 303 and the second portion of the conductive layer 303. The first portion of the conductive layer 303 may include a first interface portion 312 in contact with the dielectric material 326, and the second portion of the conductive layer 303 may include a second interface portion 312 in contact with the dielectric material 326. The first portion of the conductive layer 303 may further include a third interface portion 312 opposite the first interface portion 312. In some embodiments, the first portion of the conductive layer 303 includes a plurality of graphene layers. In some aspects, the first and third interface portions 312 of the first portion of the conductive layer 303 each includes the metal 320 (FIG. 3E) disposed between adjacent graphene layers, while a center portion 330 of the first portion of the conductive layer 303 disposed between the first and third interface portions 312 may or may not include the material 322 (FIG. 3F) disposed between adjacent graphene layers. As shown in FIG. 3I, the conductive feature 328 may be disposed on the first portion of the conductive layer 303, and the patterned mask layer 305 may be disposed on the second portion of the conductive layer 303. The dielectric material 326 may be disposed on the patterned mask layer 305 and in between the first and second portions of the conductive layer 303, and the conductive feature 328 may be disposed in the dielectric material 326.

Figure 4A:
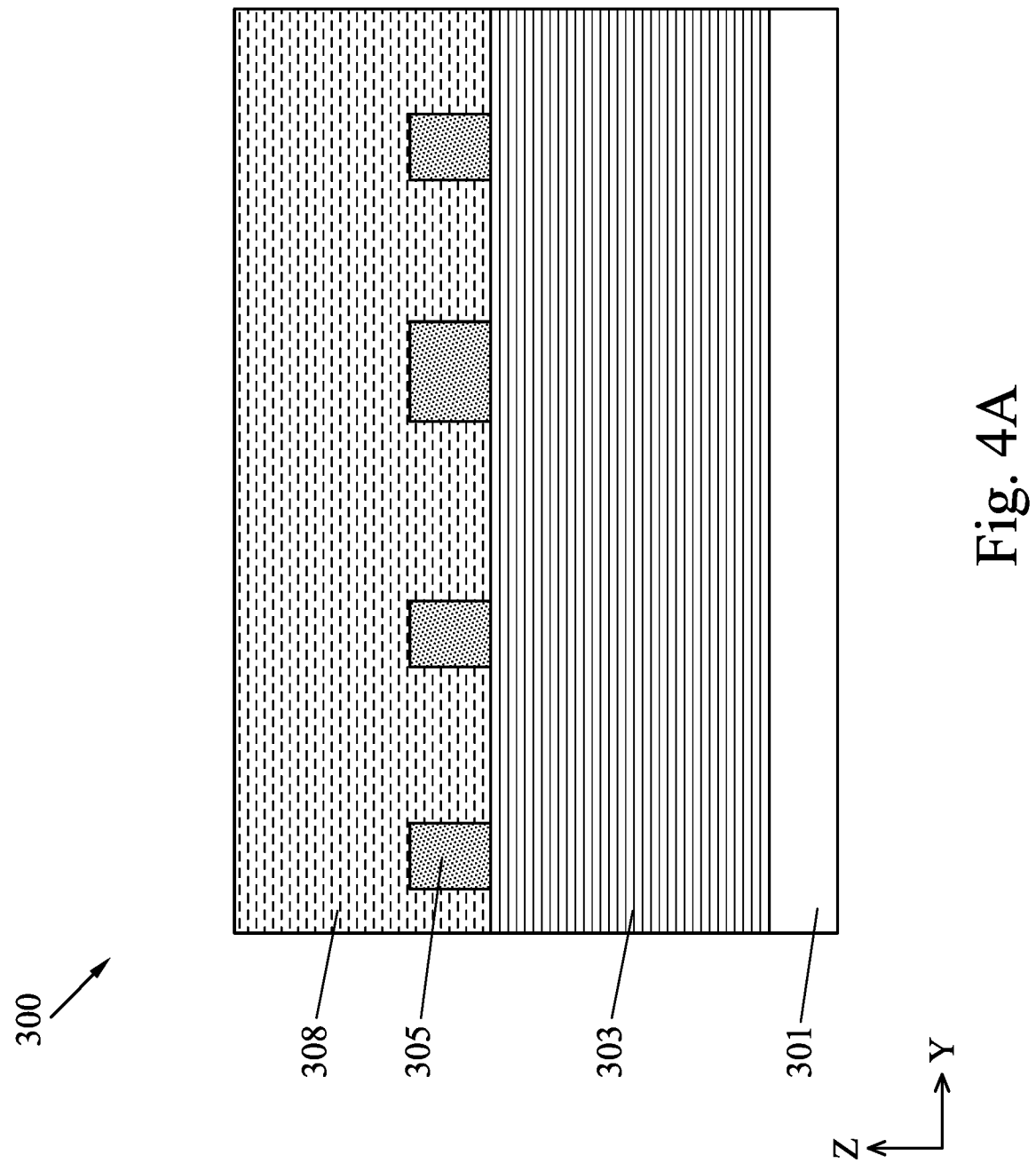
FIGS. 4A-4E are cross-sectional side views of various stages of manufacturing the interconnection structure, in accordance with alternative embodiments.
Figure 4B:
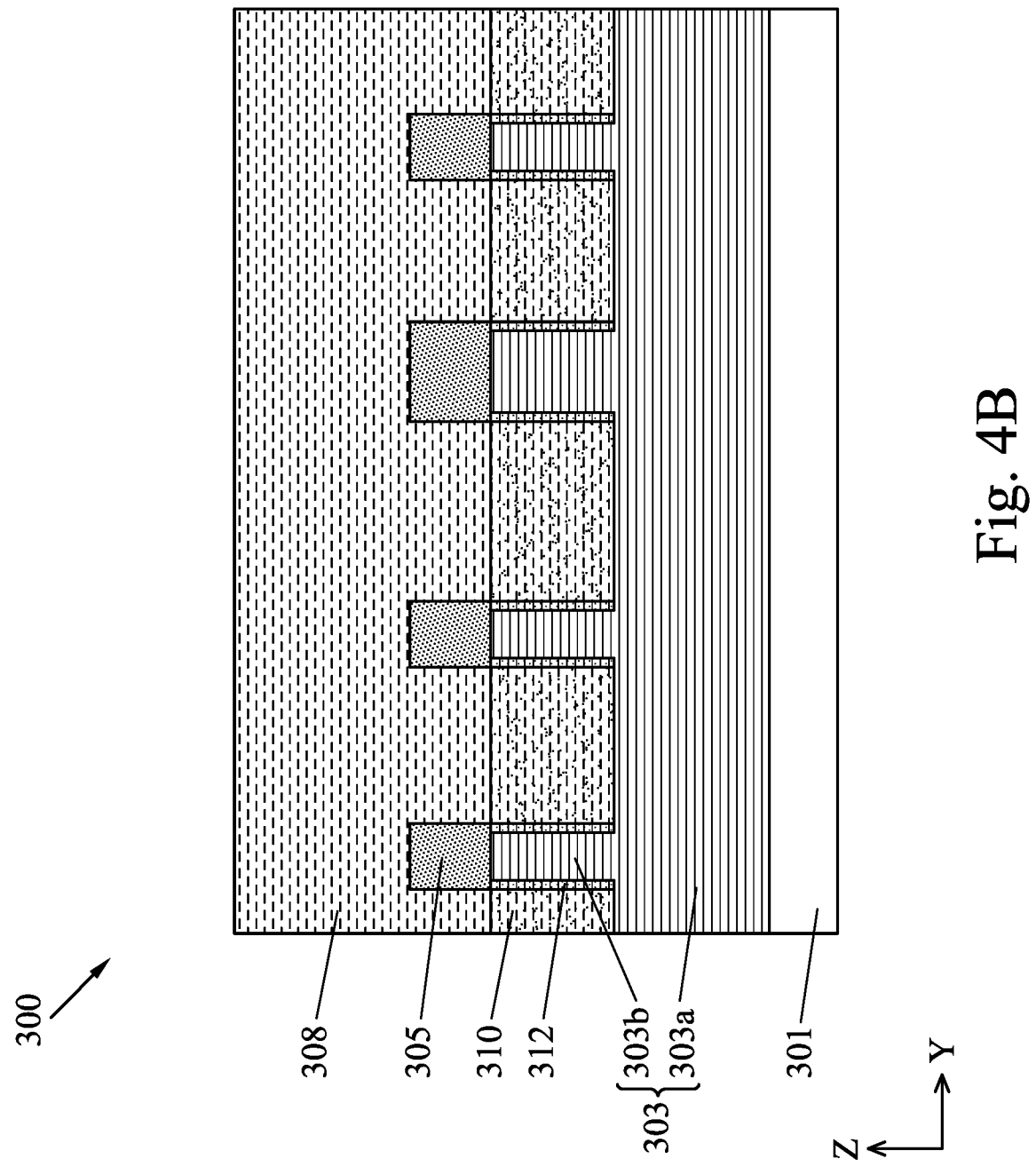

FIGS. 4A-4E are cross-sectional side views of various stages of manufacturing the interconnection structure 300, in accordance with alternative embodiments. As shown in FIG. 4A, the conductive layer 303 is formed over the dielectric layer 301, the patterned mask layer 305 is formed over the conductive layer 303, and the metal layer 308 is formed on the conductive layer 303 and the patterned mask layer 305. As shown in FIG. 4B, the interconnection structure 300 is heated to a temperature less than about 800 degrees Celsius, such as from about 200 degrees Celsius to about 450 degrees Celsius, to form the carbon-doped metal layer portion 310 and the interface portions 312. In some embodiments, the carbon-doped metal layer portion 310 does not extend through the conductive layer 303. As a result, carbon-doped metal layer portion 310 separates the conductive layer 303 into a first portion 303a and a second portion 303b disposed over the first portion 303a. The second portion 303b may include a plurality of portions extending from the first portion 303a. In some embodiments, the first portion 303a may be the conductive feature 304 shown in FIG. 2, and the second portion 303b may be the conductive feature 306 shown in FIG. 2. The second portion 303b, which may be conductive vias in some embodiments, may have a via height along the Z axis ranging from about 10 Angstroms to about 500 Angstroms. The height of the second portion 303b may be determined by the amount of the graphene layers dissolved by the metal layer 308, which may be controlled by the heating temperature and time.

Figure 4C:
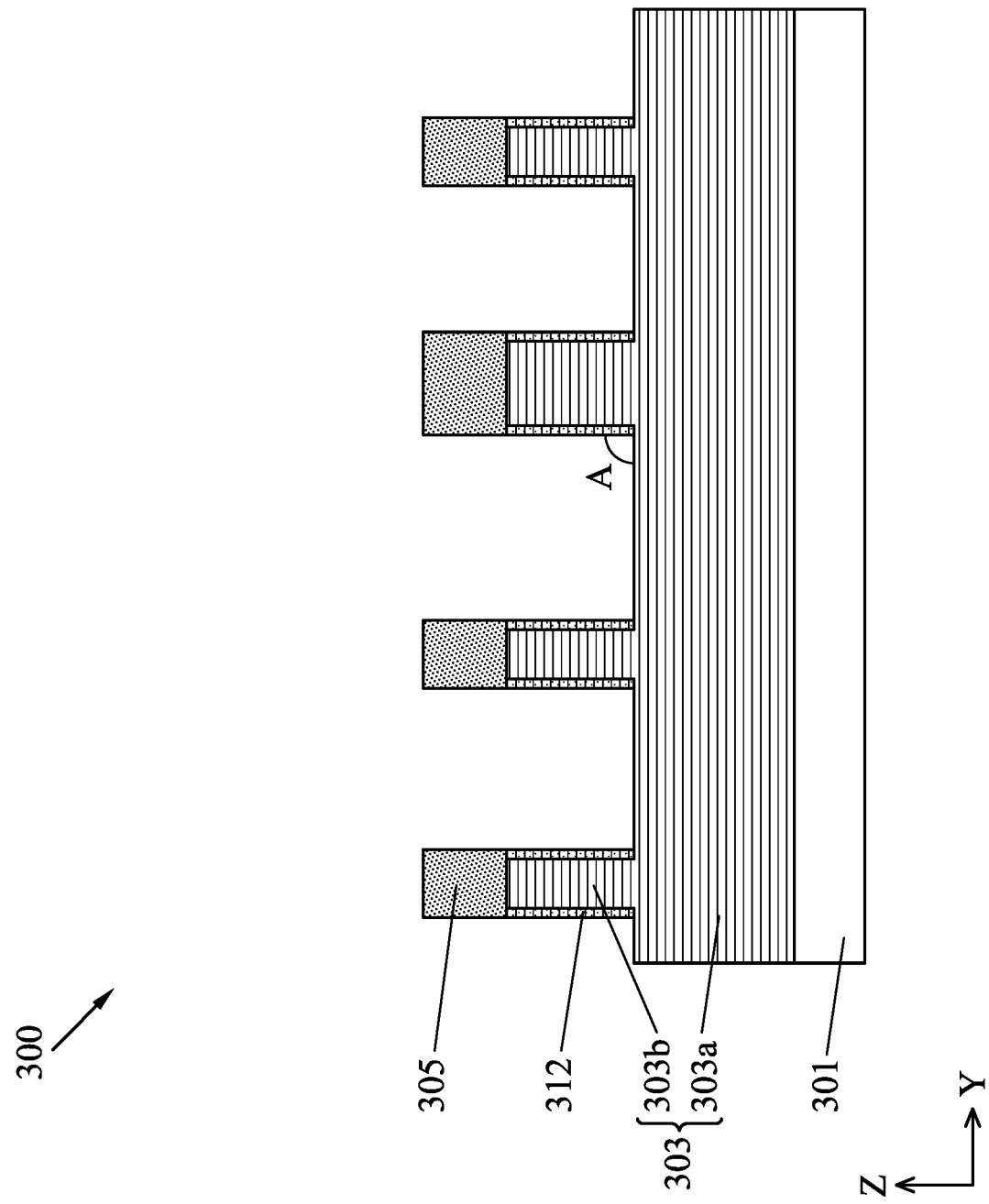
Figure 4D:
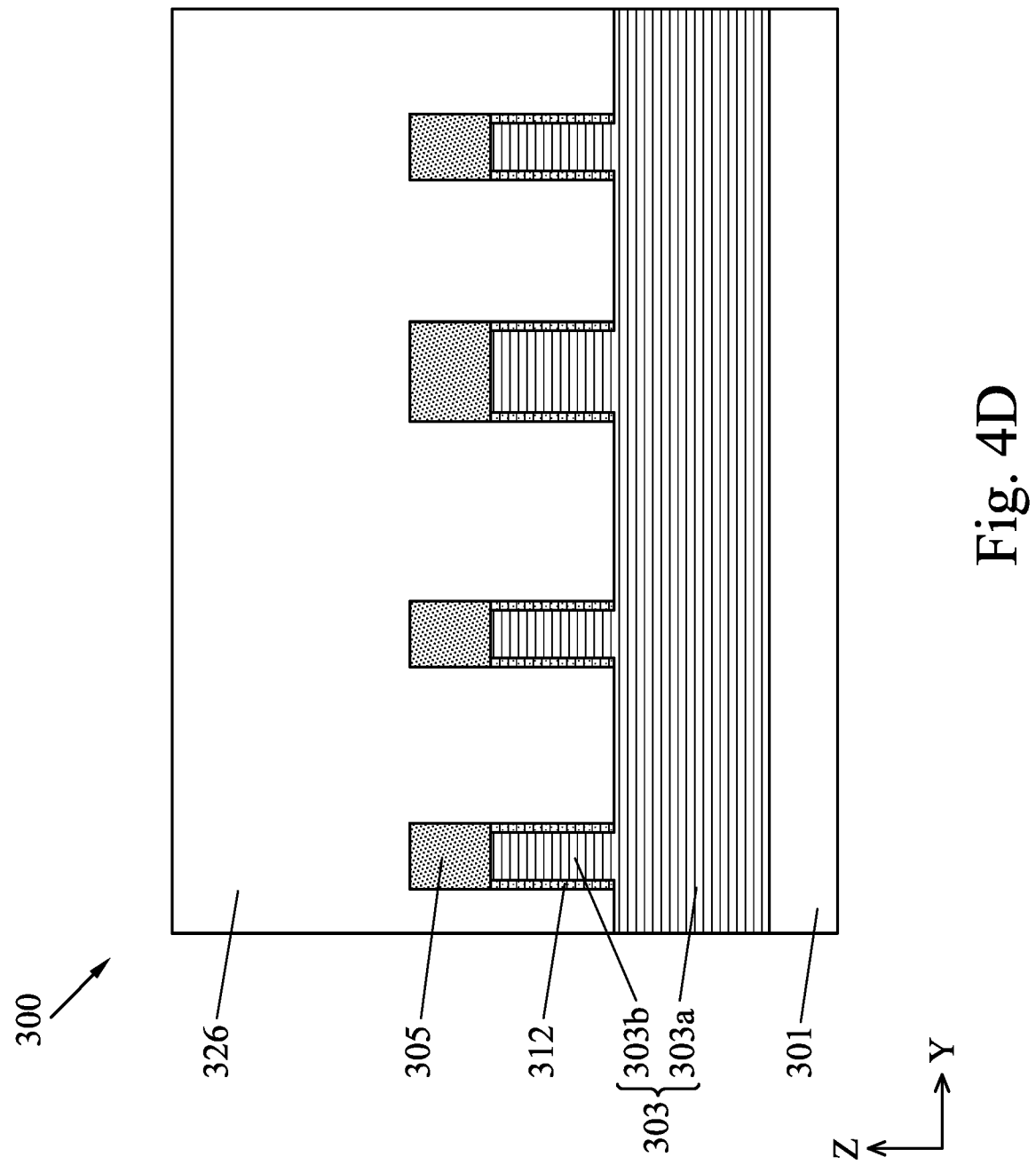
Figure 4E:
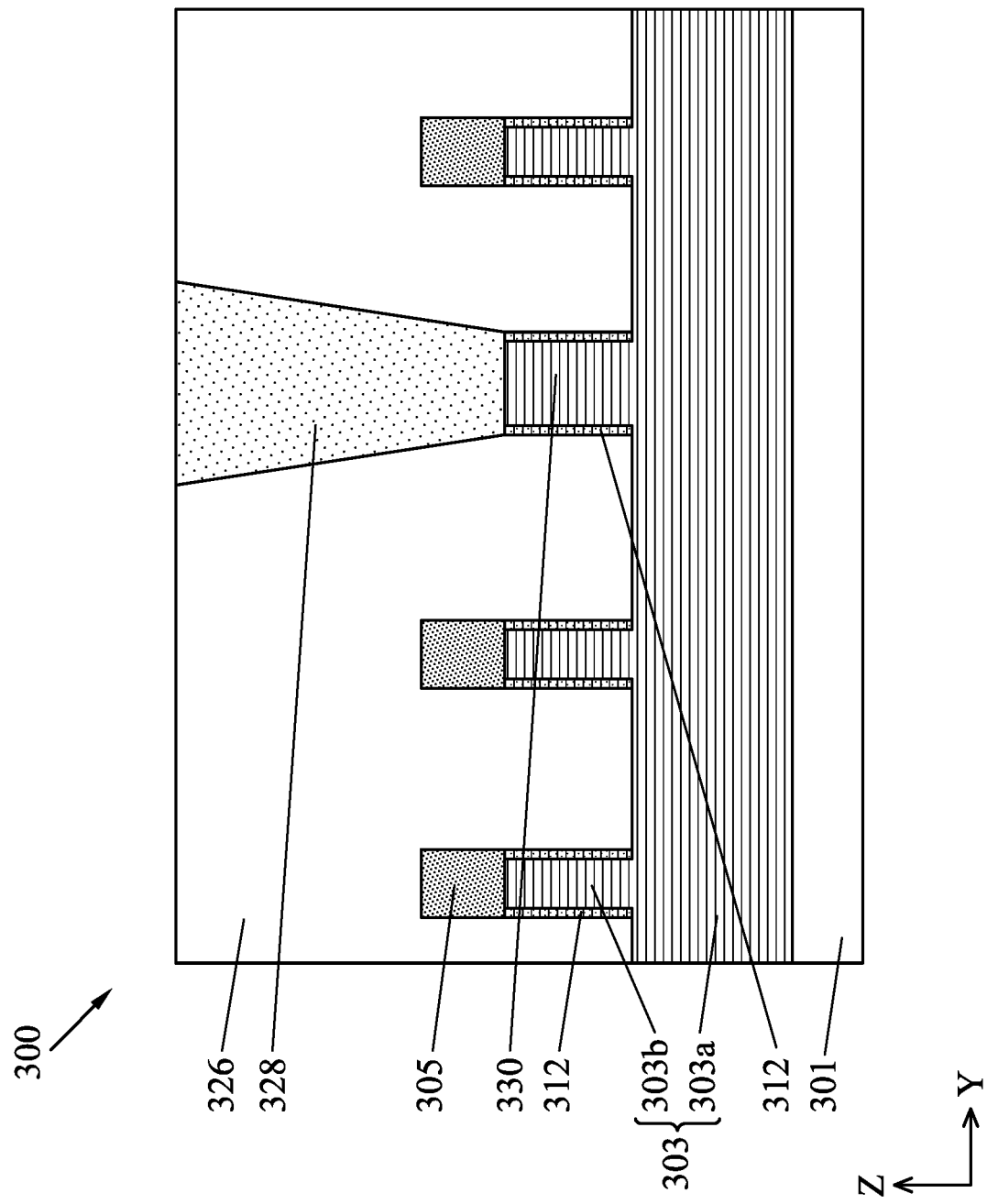

As shown in FIG. 4C, the metal layer 308 and the carbon-doped metal layer portion 310 are removed by the plasma-free etch process, such as a wet etch process. Sidewalls of the interface portion 312 may form an angle A with respect to a top surface of the first portion 303a of the conductive layer 303. The angle A may range from about 90 degrees to about 165 degrees. As shown in FIG. 4D, the dielectric material 326 is formed on the first portion 303a, the patterned mask layer 305, and between adjacent portions of the second portion 303b of the conductive layer 303. In some embodiments, the dielectric material 326 is in contact with the first portion 303a of the conductive layer 303 and the interface portion 312. As shown in FIG. 4E, the conductive feature 328 is formed in the dielectric material 326.

In some embodiments, as shown in FIG. 4E, the interconnection structure 300 includes the first portion 303a of the conductive layer 303, a second portion 303b of the conductive layer 303 disposed on the first portion 303a of the conductive layer 303, and the second portion 303b includes a third portion extending from the first portion 303a of the conductive layer and a fourth portion disposed adjacent the third portion. The dielectric material 326 is disposed between the third portion of the second portion 303b of the conductive layer 303 and the fourth portion of the second portion 303b of the conductive layer 303. The dielectric material 326 is also disposed on the first portion 303a of the conductive layer 303. The third portion of the second portion 303b of the conductive layer 303 may include a first interface portion 312 in contact with the dielectric material 326, and the fourth portion of the second portion 303b of the conductive layer 303 may include a second interface portion 312 in contact with the dielectric material 326. The third portion of the second portion 303b of the conductive layer 303 may further include a third interface portion 312 opposite the first interface portion 312. In some embodiments, the third portion of the second portion 303b of the conductive layer 303 includes a plurality of graphene layers. In some aspects, the first and third interface portions 312 of the third portion of the conductive layer 303 each includes the metal 320 (FIG. 3E) disposed between adjacent graphene layers, while a center portion 330 of the third portion of the second portion 303b of the conductive layer 303 disposed between the first and third interface portions 312 may or may not include the material 322 (FIG. 3F) disposed between adjacent graphene layers. As shown in FIG. 4E, the conductive feature 328 may be disposed on the third portion of the second portion 303b of the conductive layer 303, and the patterned mask layer 305 may be disposed on the fourth portion of the second portion 303b of the conductive layer 303. The dielectric material 326 may be disposed on the patterned mask layer 305 and in between the third and fourth portions of the second portion 303b of the conductive layer 303, and the conductive feature 328 may be disposed in the dielectric material 326.

The method of using the metal layer 308 to dissolve a portion of the conductive layer 303 followed by using a plasma-free etch process to pattern the one or more graphene layers of the conductive layer 303 provides a way to pattern one or more graphene layers without damaging any dielectric material or conductive features disposed under the one or more graphene layers. The method may not be limited to the BEOL processes. In some embodiments, the method may be used to form the conductive features, such as the conductive features 304, 306 shown in FIG. 2. In some embodiments, the method may be used to form the devices 200 shown in FIGS. 1A and 1B. In some embodiments, the method may be used to form the conductive contacts 122, 130 shown in FIGS. 1A and 1B. Th method may be used in any situation where one or more graphene layers are to be patterned.

Embodiments of the present disclosure provide an interconnection structure 300. In some embodiments, the interconnection structure 300 includes a first portion of a conductive layer 303, a second portion of the conductive layer 303 disposed adjacent the first portion of the conductive layer 303, and a dielectric material 326 disposed between the first portion of the conductive layer 303 and the second portion of the conductive layer 303. Each first and second portion of the conductive layer 303 includes first and second interface portions disposed on opposite sides of the first or second portion of the conductive layer 303. Each of the first and second interface portion includes one or more graphene layers and a metal 320 disposed between adjacent graphene layers. The metal 320 is formed by using a metal layer 308 to dissolve a portion of the conductive layer 303. Some embodiments may achieve advantages. For example, a carbon-doped metal layer portion 310 is formed by using the metal layer 308 to dissolve the portion of the conductive layer 303, and the carbon-doped metal layer portion 310 may be removed by a plasma-free etch process that does not damage the dielectric layer 301 and the conductive features formed in the dielectric layer 301.

An embodiment is an interconnection structure. The structure includes a first portion of a conductive layer, and the conductive layer includes one or more graphene layers. The first portion of the conductive layer includes a first interface portion and a second interface portion opposite the first interface portion, and each of the first and second interface portion includes a metal disposed between adjacent graphene layers. The structure further includes a second portion of the conductive layer disposed adjacent the first portion of the conductive layer, and the second portion of the conductive layer includes a third interface portion and a fourth interface portion opposite the third interface portion. Each of the third and fourth interface portion includes the metal disposed between adjacent graphene layers. The structure further includes a dielectric material disposed between the first and second portions of the conductive layer, and the dielectric material is in contact with the first and third interface portions.

Another embodiment is an interconnection structure. The structure includes a first portion of a conductive layer including one or more graphene layers, a second portion of the conductive layer disposed on the first portion of the conductive layer, and the second portion of the conductive layer includes a third portion extending from the first portion of the conductive layer and a fourth portion extending from the first portion of the conductive layer adjacent the third portion. The third portion includes a first interface portion and a second interface portion opposite the first interface portion, the fourth portion includes a third interface portion and a fourth interface portion opposite the third interface portion, and each of the first, second, third, and fourth interface portion includes a metal disposed between adjacent graphene layers. The structure further includes a dielectric material disposed between the third and fourth portions of the second portion of the conductive layer, and the dielectric material is disposed on the first portion of the conductive layer and in contact with the first and third interface portions.

A further embodiment is a method. The method includes forming a patterned mask layer on a conductive layer including one or more layers of graphene, forming a metal layer on the patterned mask layer and on the conductive layer, heating the metal layer to dissolve portions of the conductive layer to form carbon-doped metal layer portions, removing the carbon-doped metal layer portions to form one or more openings in the conductive layer, and forming a dielectric material in the one or more openings.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method, comprising:
   forming a patterned mask layer on a conductive layer, wherein the conductive layer comprises one or more layers of graphene;
   forming a metal layer on the patterned mask layer and on the conductive layer;
   heating the metal layer to dissolve portions of the conductive layer to form carbon- doped metal layer portions;
   removing the carbon-doped metal layer portions to form one or more openings in the conductive layer; and
   forming a dielectric material in the one or more openings.

2. The method of claim 1, wherein the metal layer is heated to a temperature ranging from about 200 degrees Celsius to about 450 degrees Celsius.

3. The method of claim 1, wherein the one or more openings extend through the conductive layer.

4. The method of claim 1, wherein the one or more layers of graphene are formed by direct thermal growth, plasma-assisted, diffusion-assisted, or transfer process, and the removing the carbon-doped metal layer portions is by a plasma-free etch process.

5. The method of claim 1, further comprising forming the conductive layer over a dielectric layer, wherein the carbon-doped metal layer portions are in contact with the dielectric layer.

6. The method of claim 1, wherein the patterned mask layer has a thickness that is about one percent to about 100 percent of a thickness of the conductive layer.

7. The method of claim 1, wherein the removing the carbon-doped metal layer portions is by a plasma-free etch process.

8. The method of claim 7, wherein the removing the carbon-doped metal layer portions is by a wet etch process.

9. A method, comprising:
   forming a metal layer on portions of a conductive layer, wherein the conductive layer comprises one or more layers of graphene;
   forming carbon-doped metal layer portions in the conductive layer, wherein the carbon-doped metal layer portions extend through the conductive layer;
   removing the carbon-doped metal layer portions to form one or more openings in the conductive layer; and
   forming a dielectric material in the one or more openings.

10. The method of claim 9, wherein the conductive layer is intercalated with one or more materials.

11. The method of claim 10, wherein the one or more materials comprise metals, organic compounds, inorganic compounds, or polymers and hybrid thereof.

12. The method of claim 10, wherein the one or more materials comprises a metal.

13. The method of claim 12, wherein the metal of the conductive layer is different from the metal layer.

14. The method of claim 9, wherein the forming carbon-doped metal layer portions in the conductive layer is by heating the metal layer.

15. The method of claim 14, wherein the metal layer is heated to a temperature ranging from about 200 degrees Celsius to about 450 degrees Celsius.

16. A method, comprising:
   forming a patterned mask layer on a conductive layer, wherein the conductive layer comprises one or more layers of graphene;
   forming a metal layer on the patterned mask layer and on the conductive layer;
   forming carbon-doped metal layer portions in the conductive layer;
   removing the carbon-doped metal layer portions to form one or more openings in the conductive layer;
   forming a dielectric material in the one or more openings and over the patterned mask layer; and
   forming a conductive feature in the dielectric material, wherein the conductive feature is in contact with a portion of the conductive layer.

17. The method of claim 16, wherein after forming the carbon-doped metal layer portions, the conductive layer is intercalated with a first metal and a second metal.

18. The method of claim 17, wherein the first metal is different from the second metal.

19. The method of claim 16, wherein the forming carbon-doped metal layer portions in the conductive layer is by heating the metal layer.

20. The method of claim 19, wherein the metal layer is heated to a temperature ranging from about 200 degrees Celsius to about 450 degrees Celsius.

* * * * *